(12) United States Patent
Lu et al.

(10) Patent No.: US 10,177,244 B2
(45) Date of Patent: Jan. 8, 2019

(54) SEMICONDUCTOR DEVICE AND METHOD OF MANUFACTURE

(71) Applicant: Taiwan Semiconductor Manufacturing Company, Ltd., Hsin-Chu (TW)

(72) Inventors: Bo-Cyuan Lu, New Taipei (TW); Tai-Chun Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 39 days.

(21) Appl. No.: 15/404,772

(22) Filed: Jan. 12, 2017

(65) Prior Publication Data

US 2018/0151699 A1 May 31, 2018

Related U.S. Application Data

(60) Provisional application No. 62/427,588, filed on Nov. 29, 2016.

(51) Int. Cl.

| C23C 16/30 | (2006.01) |
|---|---|
| C23C 16/34 | (2006.01) |
| H01L 21/02 | (2006.01) |
| H01L 29/66 | (2006.01) |
| H01L 29/78 | (2006.01) |

(Continued)

(52) U.S. Cl.
CPC ........ *H01L 29/66795* (2013.01); *C23C 16/30* (2013.01); *C23C 16/345* (2013.01); *C23C 16/45525* (2013.01); *H01L 21/022* (2013.01); *H01L 21/0214* (2013.01); *H01L 21/0217* (2013.01); *H01L 21/0228* (2013.01); *H01L 21/02126* (2013.01); *H01L 21/02211* (2013.01); *H01L 21/0337* (2013.01); *H01L 21/31111* (2013.01); *H01L 21/32139* (2013.01); *H01L 29/6653* (2013.01); *H01L 29/6656* (2013.01);

(Continued)

(58) Field of Classification Search
CPC ......... H01L 29/66545; H01L 29/66795; H01L 29/7848; H01L 29/0847; H01L 21/823814
See application file for complete search history.

(56) References Cited

U.S. PATENT DOCUMENTS

| 8,487,378 B2 | 7/2013 | Goto et al. |
|---|---|---|
| 8,729,634 B2 | 5/2014 | Shen et al. |

(Continued)

OTHER PUBLICATIONS

Ghandhi S. K., VLSI Fabrication Principles: Silicon and Gallium Arsenide 2nd Edition, Wiley-Interscience, pp. 639-642, 1994.*

*Primary Examiner* — Jaehwan Oh
*Assistant Examiner* — John M Parker
(74) *Attorney, Agent, or Firm* — Slater Matsil, LLP

(57) ABSTRACT

A method of manufacturing a semiconductor device comprises forming a spacer material on the semiconductor fin and the gate stack, wherein the forming the spacer material further comprises using atomic layer deposition to deposit a first material on the semiconductor fin and using atomic layer deposition to deposit a second material on the first material, wherein the second material is different from the first material. The spacer material is removed from the semiconductor fin, wherein the removing the spacer material further comprises implanting an etching modifier into the spacer material to form a modified spacer material and removing the modified spacer material.

20 Claims, 14 Drawing Sheets

(51) Int. Cl.
  *C23C 16/455* (2006.01)
  *H01L 21/033* (2006.01)
  *H01L 21/311* (2006.01)
  *H01L 21/3115* (2006.01)
  *H01L 21/3213* (2006.01)

(52) U.S. Cl.
  CPC .... *H01L 29/7851* (2013.01); *H01L 21/31155* (2013.01)

(56) References Cited

U.S. PATENT DOCUMENTS

| | | | |
|---|---|---|---|
| 8,826,213 B1 | 9/2014 | Ho et al. | |
| 8,887,106 B2 | 11/2014 | Ho et al. | |
| 2011/0101455 A1* | 5/2011 | Basker | H01L 21/26586 257/347 |
| 2014/0213067 A1* | 7/2014 | Murakami | H01L 21/0228 438/763 |
| 2014/0282326 A1 | 9/2014 | Chen et al. | |
| 2015/0270342 A1* | 9/2015 | Tsai | H01L 29/0847 257/43 |
| 2017/0207126 A1* | 7/2017 | Ching | H01L 21/823431 |
| 2017/0207324 A1* | 7/2017 | Huang | H01L 29/66803 |

* cited by examiner

SEMICONDUCTOR DEVICE AND METHOD OF MANUFACTURE

PRIORITY CLAIM

This application claims the benefit of U.S. Provisional Application No. 62/427,588, filed on Nov. 29, 2016 and entitled "Semiconductor Device and Method of Manufacture," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
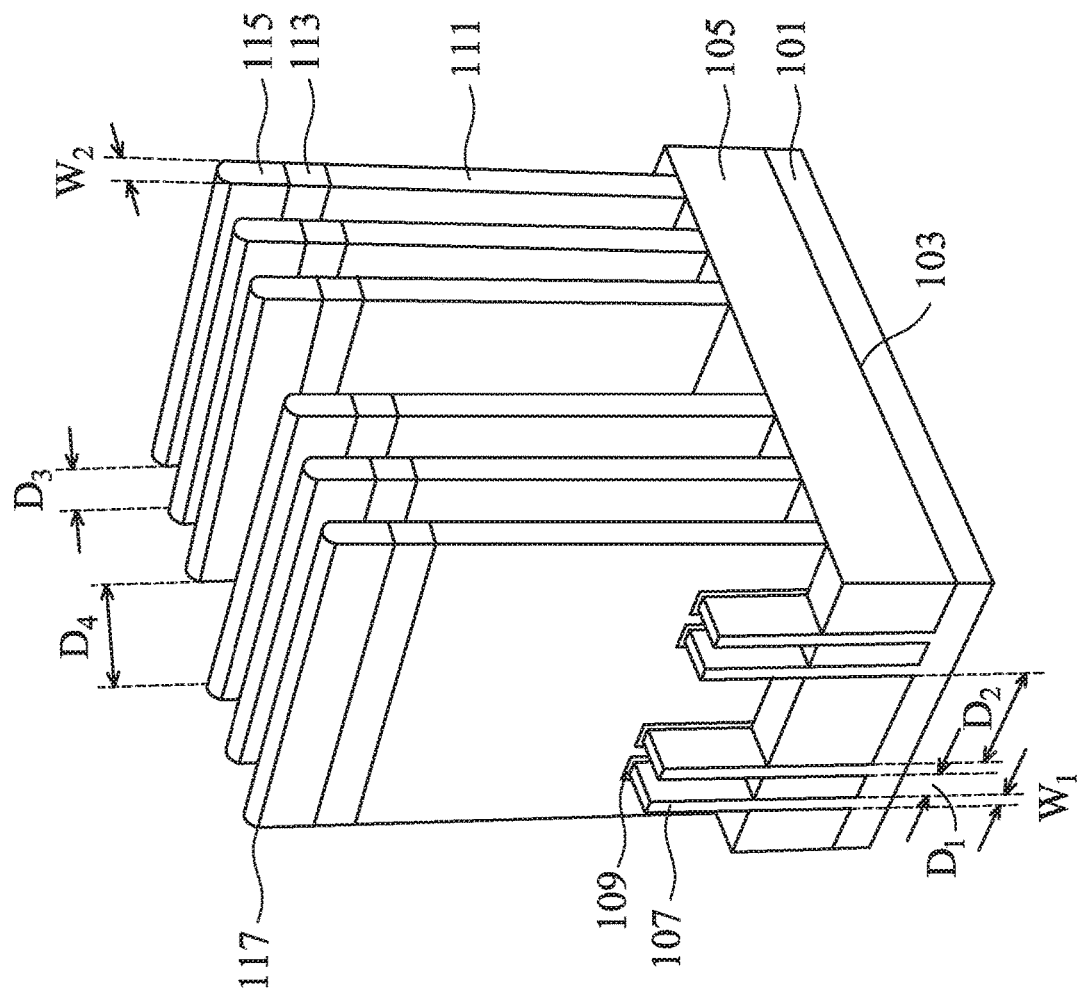
FIG. 1 illustrates a gate electrode over semiconductor fins in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment, such as a fin field effect transistor (FinFET) in a five nanometer technology node. Embodiments may also be applied, however, in other ways.

With reference now to FIG. 1, there is illustrated a substrate 101 with first trenches 103 and fins 107. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a distance of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 are formed may be utilized. Any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication may or may not be present. These fins 107 may be used, as discussed below, to form the channel region of multiple-gate FinFET transistors. While FIG. 1 only illustrates four fins 107 formed from the substrate 101, any number of fins 107 may be utilized.

The fins 107 may be formed such that they have a first width $W_1$ at the surface of the substrate 101 of between about 7 nm and about 12 nm, such as about 7 nm. Additionally, the fins 107 may be spaced apart from each other by a first distance $D_1$ of between about 12 nm and about 19 nm, such as about 13 nm, and also by a second distance $D_2$ of between about 10 nm and about 30 nm, such as about 24 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 40 Å and about 500 Å, such as about 42 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a gate dielectric material 109 and a gate electrode material 111 may be formed over each of the fins 107. In an embodiment the gate dielectric material 109 may be formed by thermal oxidation, chemical vapor deposition, atomic layer deposition, sputtering, or any other suitable method. Depending on the technique of gate dielectric formation, the gate dielectric material 109 thickness on the top of the fins 107 may be different from the gate dielectric thickness on the sidewall of the fins 107.

The gate dielectric material 109 may comprise a material such as silicon dioxide or silicon oxynitride with a thickness ranging from about 3 angstroms to about 100 angstroms, such as about 10 angstroms. In another embodiment, the gate dielectric material 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the gate dielectric material 109.

The gate electrode material 111 may comprise a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode material 111 may be deposited by chemical vapor deposition (CVD), sputter deposition, or other suitable techniques for depositing conductive materials. Ions may or may not be introduced into the gate electrode material 111 at this point. Ions may be introduced, for example, by ion implantation techniques.

Once formed, additional materials may be formed over the gate dielectric material 109 and the gate electrode material 111 as part of a patterning of the gate dielectric material 109 and the gate electrode material 111. Once patterned, the gate dielectric material 109 and the gate electrode material 111 will form multiple channel regions located on each side of the fins 107 beneath the gate dielectric material 109. In an embodiment the patterning may be initiated by depositing a first hardmask (not separately illustrated in FIG. 1) and a second hardmask (not separately illustrated in FIG. 1) over the gate electrode material 111. In an embodiment the first hardmask comprises a dielectric material such as silicon nitride, titanium nitride, silicon oxynitride, silicon, silicon oxide, titanium nitride, tantalum nitride, tungsten, combinations of these, or the like. The first hardmask may be formed using a process such as chemical vapor deposition, plasma enhanced chemical vapor deposition, atomic layer deposition, or the like, and may be formed to a thickness of about 200 Å. However, any other suitable material and method of formation may be utilized.

Once the first hardmask has been formed, the second hardmask is formed over the first hardmask in order to fill in the non-planar portions of the first hardmask that result from the non-planarity of the gate electrode material 111. In an embodiment the second hardmask may be a material different from the first hardmask, such as polysilicon, silicon oxide, silicon, silicon nitride, titanium nitride, tantalum nitride, tungsten, combinations of these, or the like, formed through a deposition process such as chemical vapor deposition or physical vapor deposition. The second hardmask may be formed to have a thickness of about 900 Å. However, any suitable material, process of formation, and thickness may be utilized.

Once the second hardmask has been formed, a planarization process may be utilized to planarize the second hardmask and the first hardmask and to remove any non-planarity between the two. In an embodiment the planarization process may be a chemical mechanical polish that is used to expose the underlying first hardmask. However, any suitable method of planarizing the first hardmask and the second hardmask may be utilized.

Once the first hardmask and the second hardmask have been planarized, a removal of the first hardmask and the second hardmask is performed which also transfers the planarity to the underlying gate electrode material 111. In an embodiment the removal of the first hardmask and the second hardmask is performed with an etch back process that removes both the material of the first hardmask and the material of the second hardmask at a suitably close rate. However, any suitable removal process may be used.

Once the gate electrode material 111 has been planarized, a third hardmask 113, a fourth hardmask 115, a mandrel material (not separately illustrated in FIG. 1) and a photoresist (not separately illustrated in FIG. 1) are placed over the gate electrode material 111. In an embodiment the third hardmask 113 comprises a dielectric material such as silicon nitride, titanium nitride, silicon oxynitride, silicon, silicon oxide, titanium nitride, tantalum nitride, tungsten, combinations of these, or the like. The third hardmask 113 may be formed using a process such as chemical vapor deposition, plasma enhanced chemical vapor deposition, atomic layer deposition, or the like, and may be formed to a thickness of between about 10 Å and about 1000 Å, such as about 200 Å. However, any other suitable material and method of formation may be utilized.

Once the third hardmask 113 has been formed, the fourth hardmask 115 is formed over the third hardmask 113. In an embodiment the fourth hardmask 115 may be a material different from the third hardmask 113, such as silicon oxide, silicon, silicon nitride, titanium nitride, tantalum nitride, tungsten, combinations of these, or the like, formed through a deposition process such as chemical vapor deposition or physical vapor deposition, or may be formed through a deposition process. The fourth hardmask 115 may be formed to have a thickness of between about 100 Å and about 5000 Å, such as about 900 Å. However, any suitable material, process of formation, and thickness may be utilized.

In an embodiment the mandrel material may be a dummy material such as dummy amorphous silicon, dummy polysilicon (DPO), or other material that may be patterned. The mandrel material may be deposited using a deposition process such as chemical vapor deposition (CVD), physical vapor deposition (PVD), combinations of these, or the like. However, any suitable material or method of deposition may be utilized.

Once the mandrel material has been formed, the photoresist is placed over the mandrel material. In an embodiment the photoresist is a tri-layer photoresist, with a bottom anti-reflective coating (BARC) layer, an intermediate mask layer, and a top photoresist layer (not separately illustrated within FIG. 1). However, any suitable type of photosensitive material or combination of materials may be utilized.

Once the photoresist has been placed over the mandrel material, the third hardmask 113, and the fourth hardmask 115, the photoresist is patterned. In an embodiment the photoresist may be patterned by exposing a photosensitive material within the photoresist (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the photoresist are different from the physical properties of the unexposed portions of the photoresist. The photoresist may then be developed with, e.g., a developer (not separately illustrated), in order to separate the exposed portion of the photoresist from the unexposed portion of the photoresist.

Once the photoresist has been patterned, a patterning process may be started that will be used to transfer the pattern of the photoresist to the mandrel material and form mandrels. In an embodiment the patterning process may be an anisotropic dry etch, such as a reactive ion etch (RIE), that may be used in order to initiate a transfer of the pattern from the photoresist to the mandrel material to form the mandrels. However, any suitable etching processes may be utilized.

Once the mandrels have been formed, the photoresist may be removed from the mandrels. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized.

Additionally, once the photoresist has been removed, spacers (not separately illustrated) may be formed on opposing sides of the mandrels. In an embodiment the spacers may be a dielectric material formed by initially blanket depositing a spacer material (not separately illustrated) and then removing horizontal portions of the spacer material using, e.g., an anisotropic etch process. Once the spacers have been formed, the mandrels may be removed from between the spacers using, e.g., a wet etch process. However, any suitable process may be utilized.

Once the spacers have been formed, the spacers may be used as a mask in order to transfer the pattern of the spacers to the third hardmask 113 and the fourth hardmask 115. In an embodiment the transfer of the pattern may be performed using, e.g., an anisotropic process such as a reactive ion etch. However, any suitable removal process may be utilized.

Additionally, once the third hardmask 113 and the fourth hardmask 115 have been patterned, the third hardmask 113 and the fourth hardmask 115 may be utilized as a mask in order to pattern the gate electrode material 111 and the gate dielectric material 109 into one or more gate stacks 117. In an embodiment the gate electrode material 111 may be patterned using an anisotropic etching process, such as a reactive ion etch. However, any suitable etching process may be used to transfer the pattern of the third hardmask 113 and the fourth hardmask 115 to the gate electrode material 111.

In an embodiment gate stacks 117 may be formed to have a second width $W_2$ of between about 10 nm and about 30 nm, such as about 16 nm. Additionally, the individual gate stacks 117 may be spaced apart from each other by a third distance $D_3$ of between about 10 nm and about 40 nm, such as about 28 nm, or a fourth distance $D_4$ of between about 20 nm and about 60 nm, such as about 44 nm. However, any suitable width and distance may be utilized.

Additionally, as one of ordinary skill in the art will recognize, while a series of steps is described above to pattern the gate electrode material 111, these steps are intended to be illustrative and not intended to limit the process to these steps. Rather, any other suitable steps may be used in addition to or in place of the steps described above. For example, performing a gate electrode material trim with an additional photoresist, etching a bottom anti-reflective coating layer after the trim or placing additional photoresists over other sections may also be utilized. Any suitable combination or series of steps may be utilized to pattern the gate electrode material 111.

Figure 2A:
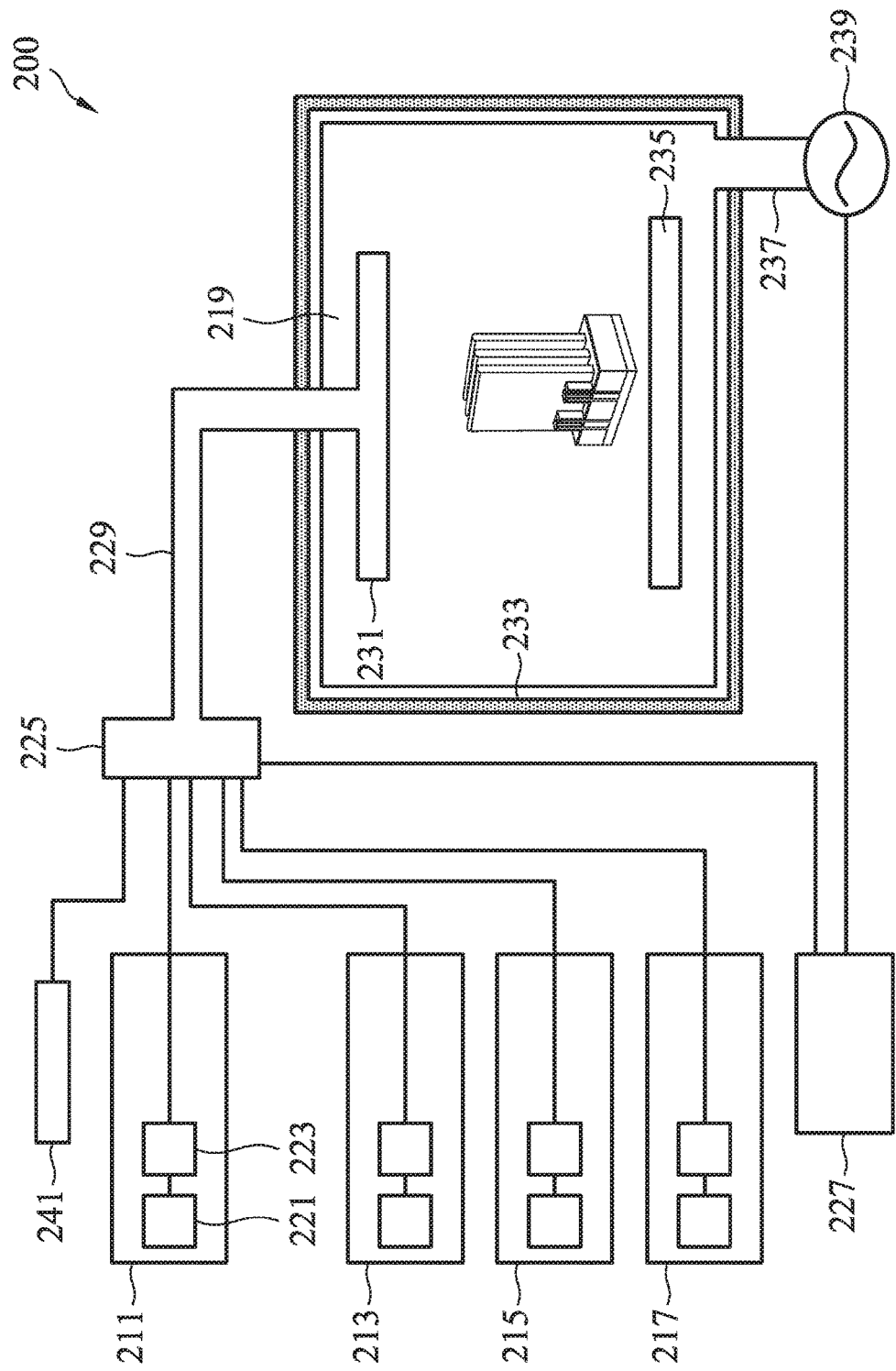
FIGS. 2A-2D illustrate formation of a spacer material in accordance with some embodiments.
Figure 2B:
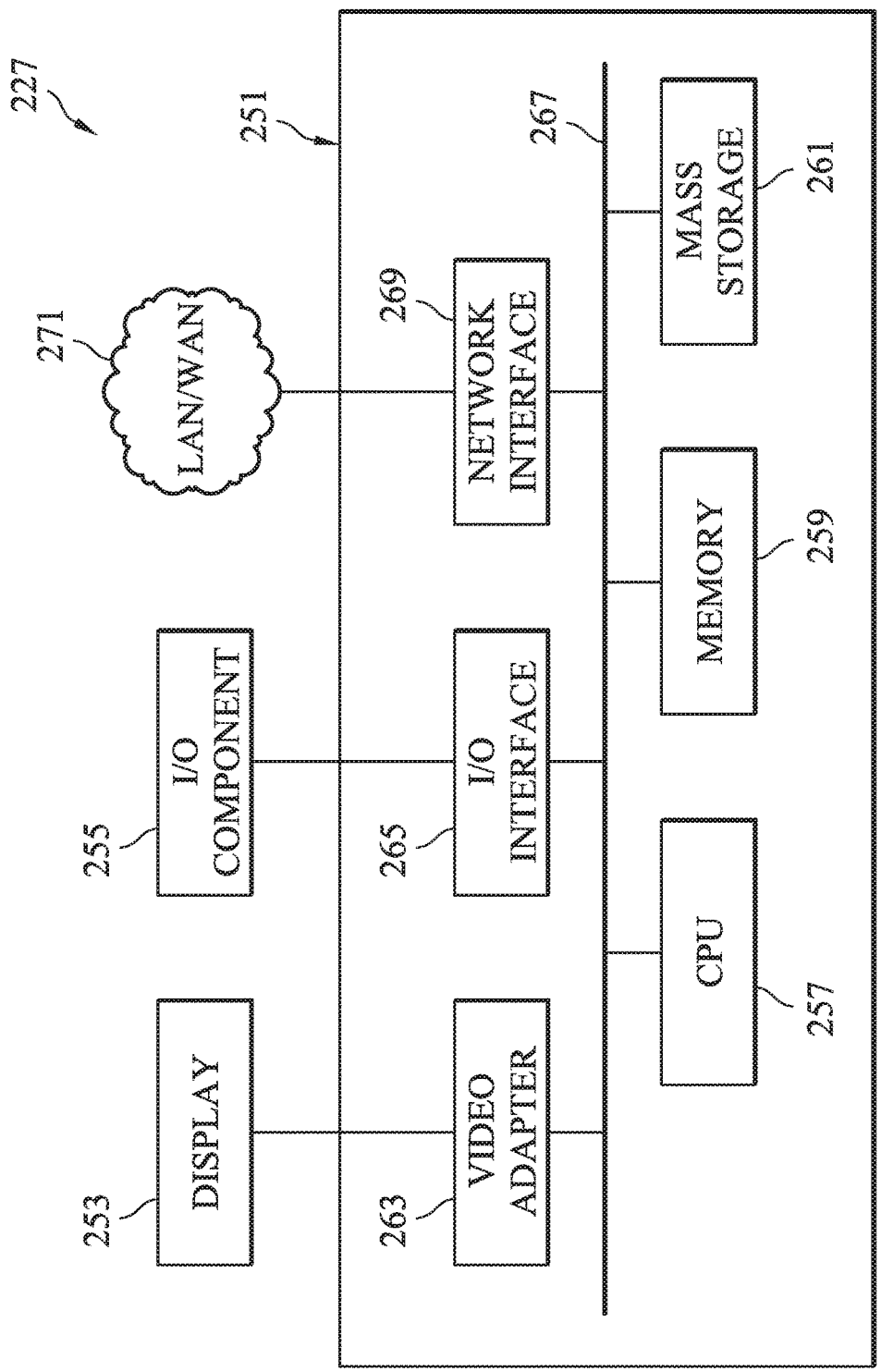
Figure 2C:
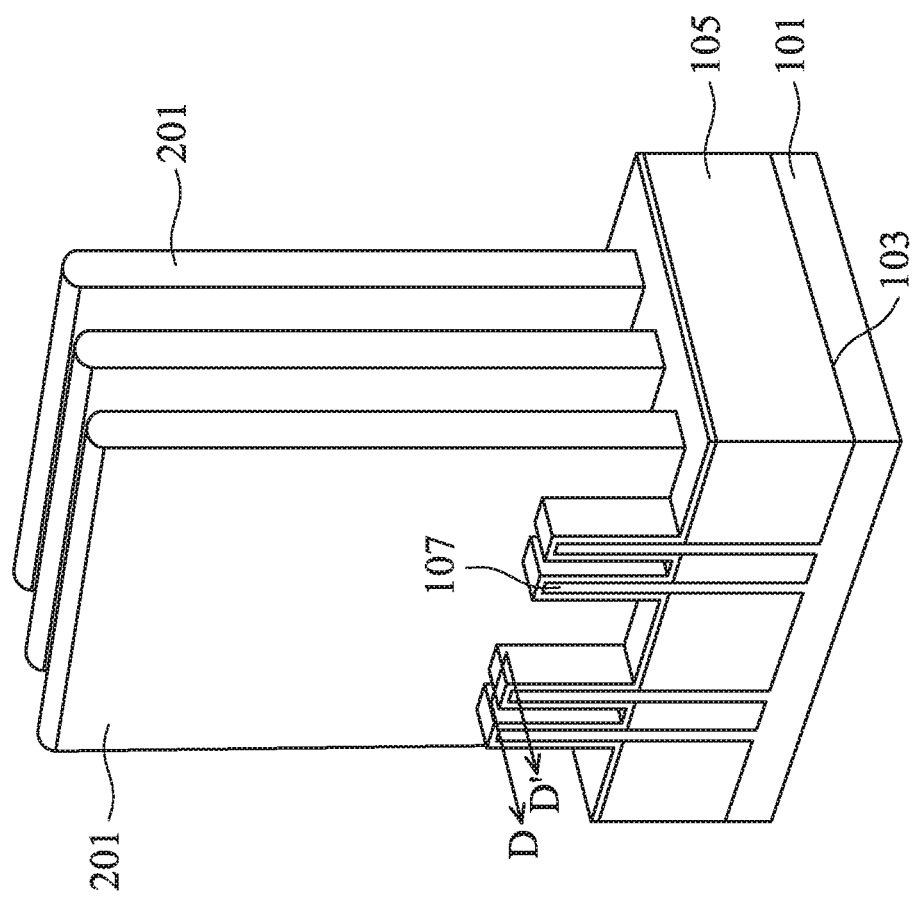
Figure 2D:
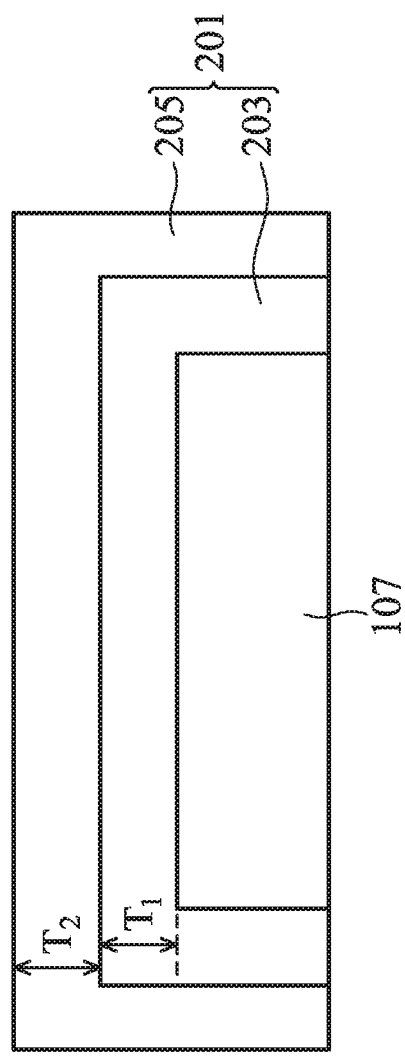

FIGS. 2A-2D illustrate a formation of a first spacer material 201 (illustrated in FIG. 2C) utilizing a deposition system 200 (illustrated in FIG. 2A-2B), with FIG. 2D being a cross-sectional view of one of the fins 207 in FIG. 2C along line D-D'. In an embodiment the first spacer material 201 may be formed as a bi-layer material, with a first layer 203 (illustrate in FIG. 2D) comprising a first dielectric material such as silicon nitride and a second layer 205 comprising a second dielectric material such as silicon oxycarbonitride (SiOCN). However, any suitable materials may be utilized.

Looking first at FIG. 2A, FIG. 2A illustrates a deposition system 200 that may be used to form both the first layer 203 and the second layer 205 using an in-situ, conformal deposition process such as atomic layer deposition. In an embodiment the deposition system 200 receives precursor materials from a first precursor delivery system 211, a second precursor delivery system 213, a third precursor delivery system 215, and a fourth precursor delivery system 217 to form a series of monolayers of materials to cover the gate stacks 117 and the fins 107. In an embodiment the first precursor delivery system 211, the second precursor delivery system 213, the third precursor delivery system 215, and the fourth precursor delivery system 217 may work in conjunction with one another to supply the various different precursor materials to a deposition chamber 219 wherein the substrate 101 is placed. However, the first precursor delivery system 211, the second precursor delivery system 213 the third precursor delivery system 215, and the fourth precursor delivery system 217 may have physical components that are similar with each other.

For example, the first precursor delivery system 211, the second precursor delivery system 213, the third precursor delivery system 215, and the fourth precursor delivery system 217 may each include a gas supply 221 and a flow controller 223 (labeled in FIG. 2A with regards to the first precursor delivery system 211 but not labeled for clarity with respect to the second precursor delivery system 213, the third precursor delivery system 215, and the fourth precursor delivery system 217). In an embodiment in which the first precursor is stored in a gaseous state, the gas supply 221 may supply the first precursor to the deposition chamber 219. The gas supply 221 may be a vessel, such as a gas storage tank, that is located either locally to the deposition chamber 219 or else may be located remotely from the deposition chamber 219. Alternatively, the gas supply 221 may be a facility that independently prepares and delivers the first precursor to the flow controller 223. Any suitable source for the first precursor may be utilized as the gas supply 221, and all such sources are fully intended to be included within the scope of the embodiments.

The gas supply 221 may supply the desired precursor to the flow controller 223. The flow controller 223 may be utilized to control the flow of the precursor to the precursor gas controller 225 and, eventually, to the deposition chamber 219, thereby also helping to control the pressure within the deposition chamber 219. The flow controller 223 may be, e.g., a proportional valve, a modulating valve, a needle valve, a pressure regulator, a mass flow controller, combinations of these, or the like. However, any suitable method for controlling and regulating the flow may be utilized, and all such components and methods are fully intended to be included within the scope of the embodiments.

However, as one of ordinary skill in the art will recognize, while the first precursor delivery system 211, the second precursor delivery system 213, the third precursor delivery system 215, and the fourth precursor delivery system 217 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 200, may alternatively be utilized. All such precursor systems are fully intended to be included within the scope of the embodiments.

Additionally, in an embodiment in which the first precursor is stored in a solid or liquid state, the gas supply 221 may store a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to a precursor gas controller 225. Any suitable method and combination of units may be utilized to provide the first precursor, and all such combination of units are fully intended to be included within the scope of the embodiments.

The first precursor delivery system 211, the second precursor delivery system 213, the third precursor delivery system 215 and the fourth precursor delivery system 217 may supply their individual precursor materials into the precursor gas controller 225. The precursor gas controller 225 connects and isolates the first precursor delivery system 211, the second precursor delivery system 213, the third precursor delivery system 215 and the fourth precursor delivery system 217 to and from the deposition chamber 219 in order to deliver the desired precursor materials to the deposition chamber 219. The precursor gas controller 225 may include such devices as valves, flow meters, sensors, and the like to control the delivery rates of each of the precursors, and may be controlled by instructions received from the control unit 227 (described further below with respect to FIG. 2B).

The precursor gas controller 225, upon receiving instructions from the control unit 227, may open and close valves so as to connect one of the first precursor delivery system 211, the second precursor delivery system 213, the third precursor delivery system 215 and the fourth precursor delivery system 217 to the deposition chamber 219 and direct a desired precursor material through a manifold 229, into the deposition chamber 219, and to a showerhead 231. The showerhead 231 may be utilized to disperse the chosen precursor material into the deposition chamber 219 and may be designed to evenly disperse the precursor material in order to minimize undesired process conditions that may arise from uneven dispersal. In an embodiment the showerhead 231 may have a circular design with openings dispersed evenly around the showerhead 231 to allow for the dispersal of the desired precursor material into the deposition chamber 219.

However, as one of ordinary skill in the art will recognize, the introduction of precursor materials to the deposition chamber 219 through a single showerhead 231 or through a single point of introduction as described above is intended to be illustrative only and is not intended to be limiting to the embodiments. Any number of separate and independent showerheads 231 or other openings to introduce precursor materials into the deposition chamber 219 may alternatively be utilized. All such combinations of showerheads and other points of introduction are fully intended to be included within the scope of the embodiments.

The deposition chamber 219 may receive the desired precursor materials and expose the precursor materials to the sidewalls of the gate stacks 117 and the fins 107, and the deposition chamber 219 may be any desired shape that may be suitable for dispersing the precursor materials and contacting the precursor materials with the sidewalls of the gate stacks 117 and the fins 107. In the embodiment illustrated in FIG. 2A, the deposition chamber 219 has a cylindrical sidewall and a bottom. However, the deposition chamber 219 is not limited to a cylindrical shape, and any other suitable shape, such as a hollow square tube, an octagonal shape, or the like, may be utilized. Furthermore, the deposition chamber 219 may be surrounded by a housing 233 made of material that is inert to the various process materials. As such, while the housing 233 may be any suitable material that can withstand the chemistries and pressures involved in the deposition process, in an embodiment the housing 233 may be steel, stainless steel, nickel, aluminum, alloys of these, combinations of these, and like.

Within the deposition chamber 219 the substrate 101 may be placed on a mounting platform 235 in order to position and control the substrate 101 during the deposition processes. The mounting platform 235 may include heating mechanisms in order to heat the substrate 101 during the deposition processes. Furthermore, while a single mounting platform 235 is illustrated in FIG. 2A, any number of mounting platforms 235 may additionally be included within the deposition chamber 219.

Additionally, the deposition chamber 219 and the mounting platform 235 may be part of a cluster tool system (not shown). The cluster tool system may be used in conjunction with an automated handling system in order to position and place the substrate 101 into the deposition chamber 219 prior to the deposition processes, position, hold the substrate 101 during the deposition processes, and remove the substrate 101 from the deposition chamber 219 after the deposition processes.

The deposition chamber 219 may also have an exhaust outlet 237 for exhaust gases to exit the deposition chamber 219. A vacuum pump 239 may be connected to the exhaust outlet 237 of the deposition chamber 219 in order to help evacuate the exhaust gases. The vacuum pump 239, under control of the control unit 227, may also be utilized to reduce and control the pressure within the deposition chamber 219 to a desired pressure and may also be utilized to evacuate precursor materials from the deposition chamber 219 in preparation for the introduction of the next precursor material.

FIG. 2B illustrates an embodiment of the control unit 227 that may be utilized to control the precursor gas controller 225 and the vacuum pump 239 (as illustrated in FIG. 2A). The control unit 227 may be any form of computer processor that can be used in an industrial setting for controlling process machines. In an embodiment the control unit 227 may comprise a processing unit 251, such as a desktop computer, a workstation, a laptop computer, or a dedicated unit customized for a particular application. The control unit 227 may be equipped with a display 253 and one or more input/output components 255, such as instruction outputs, sensor inputs, a mouse, a keyboard, printer, combinations of these, or the like. The processing unit 251 may include a central processing unit (CPU) 257, memory 259, a mass storage device 261, a video adapter 263, and an I/O interface 265 connected to a bus 267.

The bus 267 may be one or more of any type of several bus architectures including a memory bus or memory controller, a peripheral bus, or video bus. The CPU 257 may comprise any type of electronic data processor, and the memory 259 may comprise any type of system memory, such as static random access memory (SRAM), dynamic random access memory (DRAM), or read-only memory (ROM). The mass storage device 261 may comprise any type of storage device configured to store data, programs, and other information and to make the data, programs, and other information accessible via the bus 267. The mass storage device 261 may comprise, for example, one or more of a hard disk drive, a magnetic disk drive, or an optical disk drive.

The video adapter 263 and the I/O interface 265 provide interfaces to couple external input and output devices to the processing unit 251. As illustrated in FIG. 2B, examples of input and output devices include the display 253 coupled to the video adapter 263 and the I/O component 255, such as a mouse, keyboard, printer, and the like, coupled to the I/O interface 265. Other devices may be coupled to the processing unit 251, and additional or fewer interface cards may be utilized. For example, a serial interface card (not shown) may be used to provide a serial interface for a printer. The processing unit 251 also may include a network interface 269 that may be a wired link to a local area network (LAN) or a wide area network (WAN) 271 and/or a wireless link.

It should be noted that the control unit 227 may include other components. For example, the control unit 227 may include power supplies, cables, a motherboard, removable storage media, cases, and the like. These other components, although not shown in FIG. 2B, are considered part of the control unit 227.

Returning to FIG. 2A and looking also at FIG. 2D, in an embodiment the formation of the first layer 203 may be initiated by putting a first precursor material into the first precursor delivery system 211. For example, in an embodiment in which the first layer 203 is silicon nitride, the first precursor material may be a precursor such as hexachlorodisilane ($Si_2Cl_6$) and may be placed into the first precursor delivery system 211. However, as one of ordinary skill in the art will recognize, this precursor is not the only precursor that may be utilized to form a layer of silicon nitride, and the use of hexachlorodisilane is not intended to be limiting to the embodiments. Any suitable precursor material in any suitable phase (solid, liquid, or gas) to form a layer of silicon nitride, such as dichlorosilane, or any other precursor that may be used to form other materials, may be utilized.

Additionally, a second precursor material may be placed into the second precursor delivery system 213. In the embodiment in which a layer of silicon nitride is the desired material for the first layer 203, the second precursor material may be a precursor material that may contain nitrogen in order to react with the first precursor material to form a monolayer of silicon nitride. For example, in the embodiment in which hexachlorodisilane is utilized as the first precursor material, ammonia ($NH_3$) may be used as the second precursor material and may be placed into the second precursor delivery system 213. However, the description of ammonia as the second precursor material is not intended to be limiting to the embodiments, and any other suitable precursor material, such as $N_2$, or the like, may be utilized as the second precursor material.

Once the first precursor material and the second precursor material have been placed into the first precursor delivery system 211 and the second precursor delivery system 213, respectively, the formation of the first layer 203 may be initiated by the control unit 227 sending an instruction to the precursor gas controller 225 to connect the first precursor delivery system 211 to the deposition chamber 219. Once connected, the first precursor delivery system 211 can deliver the first precursor material (e.g., the hexachlorodisilane) to the showerhead 231 through the precursor gas controller 225 and the manifold 229. The showerhead 231 can then disperse the first precursor material into the deposition chamber 219, wherein the first precursor material can be adsorbed and react to the exposed surfaces of the gate stack 117 and the fins 107.

In the embodiment to form a layer of silicon nitride, the first precursor material may be flowed into the deposition chamber 219 at a flow rate of between about 0.1 slm and about 3 slm for about 12 seconds per cycle. Additionally, the deposition chamber 219 may be held at a pressure of between about 0.1 torr and about 5 torr, such as about 0.5 torr, and a temperature of between about 570° C. and about 650° C. However, as one of ordinary skill in the art will recognize, these process conditions are only intended to be illustrative, as any suitable process conditions may be utilized while remaining within the scope of the embodiments.

As the first precursor material is adsorbed onto the surfaces of the gate stack 117 and the fins 107, the first precursor material will react with open active sites located on the exposed surfaces. However, once all of the open active sites on the exposed surfaces have reacted with the first precursor material, the reaction will stop, as there are no more open active sites to which the first precursor material will bond. This limitation causes the reaction of the first precursor material with the exposed surfaces of the gate stack 117 and the fins 107 to be self-limiting and to form a monolayer of the reacted first precursor material on the surfaces of the gate stack 117 and the fins 107, thereby allowing for a more precise control of the thickness of the first layer 203.

After the self-limiting reaction has finished, the deposition chamber 219 may be purged of the first precursor material. For example, the control unit 227 may instruct the precursor gas controller 225 to disconnect the first precursor delivery system 211 (containing the first precursor material to be purged from the deposition chamber 219) and to connect a purge gas delivery system 241 to deliver a purge gas to the deposition chamber 219. In an embodiment the purge gas delivery system 241 may be a gaseous tank or other facility that provides a purge gas such as nitrogen, argon, xenon, or other non-reactive gas to the deposition chamber 219. Additionally, the control unit 227 may also initiate the vacuum pump 239 in order to apply a pressure differential to the deposition chamber 219 to aid in the removal of the first precursor material. The purge gas, along with the vacuum pump 239, may purge the first precursor material from the deposition chamber 219 for about 3 seconds.

After the purge of the first precursor material has been completed, the introduction of the second precursor material (e.g., ammonia) to the deposition chamber 219 may be initiated by the control unit 227 sending an instruction to the precursor gas controller 225 to disconnect the purge gas delivery system 241 and to connect the second precursor delivery system 213 (containing the second precursor material) to the deposition chamber 219. Once connected, the second precursor delivery system 213 can deliver the second precursor material to the showerhead 231. The showerhead 231 can then disperse the second precursor material into the deposition chamber 219, wherein the second precursor material can be adsorbed on the exposed surfaces of the gate stack 117 and the fins 107 and react with the first precursor material in another self-limiting reaction to form a monolayer of the desired material, e.g., silicon nitride, on the exposed surfaces of the gate stack 117 and the fins 107. In a particular embodiment, the reaction may occur as described in formula (1).

$$3Si_2Cl_6 + 26NH_3 \rightarrow 2Si_3N_4 + 18NH_4Cl + 3H_2 \qquad (1)$$

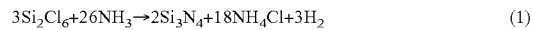

In the embodiment discussed above to form a layer of silicon nitride with hexachlorodisilane, the ammonia may be introduced into the deposition chamber 219 at a flow rate of between about 1 slm and about 10 slm, such as about 4.5 slm, for about 30 seconds. Additionally, the deposition chamber 219 may be held at a pressure of between about 1 torr and about 10 torr, such as about 6.98 torr, and a temperature of between about 570° C. and about 650° C. However, as one of ordinary skill in the art will recognize, these process conditions are only intended to be illustrative, as any suitable process conditions may be utilized to introduce the second precursor material while remaining within the scope of the embodiments.

After the monolayer of the desired material, e.g., silicon nitride, has been formed, the deposition chamber 219 may be purged (leaving behind the monolayer of the desired material on the exposed surfaces of the gate stack 117 and the fins 107) using, e.g., the purge gas from the purge gas delivery system 241 for about three seconds. After the deposition chamber 219 has been purged, a first cycle for the formation of the desired material has been completed, and a second cycle similar to the first cycle may be started. For example, the repeated cycle may introduce the first precursor material, purge with the purge gas, pulse with the second precursor, and purge with the purge gas. These cycles may be repeated until the first layer 203 has a first thickness $T_1$ of between about 10 Å and about 40 Å, such as about 2 nm.

However, as one of ordinary skill in the art will recognize, the above described process to form the first layer 203 is intended to be illustrative and is not intended to be limiting to the embodiments. Any other suitable process, such as initially pulsing the second precursor material (e.g., ammonia), purging with the purge gas, introducing the first precursor material (e.g., hexachlorodisilane), and purging with the purge gas to complete a first cycle and then repeating the first cycle, may be utilized. This and any other suitable process to form the first layer 203 are fully intended to be included within the scope of the embodiments.

Once the first layer 203 has been formed to the desired thickness, the second layer 205 may be formed over the first layer 203 in-situ and in the same deposition chamber 219 without breaking to atmosphere. In an embodiment the formation of the second layer 205 may be initiated, after placing the first precursor into the first precursor delivery system 211 and the second precursor into the second precursor delivery system 213, by placing a third precursor into the third precursor delivery system 215 and a fourth precursor into the fourth precursor delivery system 217. For example, in an embodiment in which the second layer 205 is SiOCN, the third precursor material and the fourth precursor material may be precursors that can be used with the first precursor material and the second precursor material to form the material for the second layer 205 (e.g., SiOCN). In a particular embodiment in which the first precursor material is $Si_2Cl_6$ and the second precursor material is ammonia, the third precursor material may be a precursor such as oxygen and may be placed into the third precursor delivery system 215. However, as one of ordinary skill in the art will recognize, this precursor is not the only precursor that may be utilized to form a layer of SiOCN, and the use of oxygen is not intended to be limiting to the embodiments. Any suitable precursor material in any suitable phase (solid, liquid, or gas) to form a layer of SiOCN, such as ozone, or any other precursor that may be used, may be utilized.

Additionally, the fourth precursor material may be placed into the fourth precursor delivery system 217. In the embodiment in which a layer of SiOCN is the desired material for the second layer 205, the fourth precursor material may be a precursor material that may contain carbon in order to react with the first precursor material, the second precursor material, and the third precursor material to form a monolayer of SiOCN. For example, in the embodiment in which the first precursor material is $Si_2Cl_6$, the second precursor material is ammonia, and the third precursor material is oxygen, propene ($C_3H_6$) may be used as the fourth precursor material and may be placed into the fourth precursor delivery system 217. However, the description of propene as the fourth precursor material is not intended to be limiting to the embodiments, and any other suitable precursor material, combinations of these, or the like, may be utilized as the fourth precursor material.

Once the third precursor material and the fourth precursor material have been placed into the third precursor delivery system 215 and the fourth precursor delivery system 217, respectively, the formation of the second layer 205 may be initiated by the control unit 227 sending an instruction to the precursor gas controller 225 to connect the first precursor delivery system 211 to the deposition chamber 219. Once connected, the first precursor delivery system 211 can deliver the first precursor material (e.g., the hexachlorodisilane) to the showerhead 231 through the precursor gas controller 225 and the manifold 229. The showerhead 231 can then disperse the first precursor material into the deposition chamber 219, wherein the first precursor material can be adsorbed and react to the exposed surfaces of the first layer 203.

In the embodiment to form a layer of SiOCN, the first precursor material may be flowed into the deposition chamber 219 at a flow rate of between about 0.1 slm and about 0.6 slm for about 20 seconds per cycle. Additionally, the deposition chamber 219 may be held at a pressure of between about 0.2 torr and about 1 torr, such as about 0.825 torr. Additionally, the temperature of the formation of the second layer 205 may be the same as the formation of the first layer 203 and may be between about 570° C. and about 650° C. However, as one of ordinary skill in the art will recognize, these process conditions are only intended to be illustrative, as any suitable process conditions may be utilized while remaining within the scope of the embodiments.

As the first precursor material is adsorbed onto the surfaces of the first layer 203, the first precursor material will react with open active sites located on the exposed surfaces. However, once all of the open active sites on the exposed surfaces have reacted with the first precursor material, the reaction will stop, as there are no more open active sites to which the first precursor material will bond. This limitation causes the reaction of the first precursor material with the exposed surfaces of the first layer 203 to be self-limiting and to form a monolayer of the reacted first precursor material on the surfaces of the first layer 203, thereby allowing for a more precise control of the thickness of the second layer 205.

After the self-limiting reaction has finished, the deposition chamber 219 may be purged of the first precursor material. For example, the control unit 227 may instruct the precursor gas controller 225 to disconnect the first precursor delivery system 211 (containing the first precursor material to be purged from the deposition chamber 219) and to connect the purge gas delivery system 241 to deliver the purge gas to the deposition chamber 219. The purge gas, along with the vacuum pump 239, may purge the first precursor material from the deposition chamber 219 for about 3 seconds.

After the purge of the first precursor material has been completed, the introduction of the third precursor material (e.g., oxygen) to the deposition chamber 219 may be initiated by the control unit 227 sending an instruction to the precursor gas controller 225 to disconnect the purge gas delivery system 241 and to connect the third precursor delivery system 215 (containing the third precursor material) to the deposition chamber 219. Once connected, the third precursor delivery system 215 can deliver the third precursor material to the showerhead 231. The showerhead 231 can then disperse the third precursor material into the deposition chamber 219, wherein the third precursor material can be adsorbed on the exposed surfaces of the first layer 203 and react with the first precursor material in another self-limiting reaction on the exposed surfaces of the first layer 203.

In the embodiment discussed above to form a layer of SiOCN with hexachlorodisilane, oxygen, propene, and ammonia, the oxygen may be introduced into the deposition chamber 219 at a flow rate of between about 1 slm and about 10 slm, such as about 5 slm, for about 14 seconds. Additionally, the deposition chamber 219 may be held at a pressure of between about 1 torr and about 10 torr, such as about 9 torr, and a temperature of between about 570° C. and about 650° C. However, as one of ordinary skill in the art will recognize, these process conditions are only intended to be illustrative, as any suitable process conditions may be utilized to introduce oxygen while remaining within the scope of the embodiments.

After the self-limiting reaction has finished, the deposition chamber 219 may be purged of the third precursor material. For example, the control unit 227 may instruct the precursor gas controller 225 to disconnect the third precursor delivery system 215 (containing the third precursor material to be purged from the deposition chamber 219) and to connect the purge gas delivery system 241 to deliver the purge gas to the deposition chamber 219. The purge gas, along with the vacuum pump 239, may purge the third precursor material from the deposition chamber 219 for about 3 seconds.

After the purge of the third precursor material has been completed, the introduction of the fourth precursor material (e.g., propene) to the deposition chamber 219 may be initiated by the control unit 227 sending an instruction to the precursor gas controller 225 to disconnect the purge gas delivery system 241 and to connect the fourth precursor delivery system 217 (containing the fourth precursor material) to the deposition chamber 219. Once connected, the fourth precursor delivery system 217 can deliver the fourth precursor material to the showerhead 231. The showerhead 231 can then disperse the fourth precursor material into the deposition chamber 219, wherein the fourth precursor material can be adsorbed on the exposed surfaces of the first layer 203 and react with the product of the first precursor material and the third precursor material in another self-limiting reaction on the exposed surfaces of the first layer 203.

In the embodiment discussed above to form a layer of SiOCN with hexachlorodisilane, oxygen, and ammonia, the propene may be introduced into the deposition chamber 219 at a flow rate of between about 1 slm and about 10 slm, such as about 5.5 slm, for about 60 seconds. Additionally, the deposition chamber 219 may be held at a pressure of between about 10 torr and about 50 torr, such as about 34.87 torr, and a temperature of between about 570° C. and about 650° C. However, as one of ordinary skill in the art will recognize, these process conditions are only intended to be illustrative, as any suitable process conditions may be utilized to introduce propene while remaining within the scope of the embodiments.

After the self-limiting reaction has finished, the deposition chamber 219 may be purged of the fourth precursor material. For example, the control unit 227 may instruct the precursor gas controller 225 to disconnect the fourth precursor delivery system 217 (containing the fourth precursor material to be purged from the deposition chamber 219) and to connect the purge gas delivery system 241 to deliver a purge gas to the deposition chamber 219. The purge gas, along with the vacuum pump 239, may purge the fourth precursor material from the deposition chamber 219 for about 3 seconds.

After the purge of the fourth precursor material has been completed, the introduction of the second precursor material (e.g., ammonia) to the deposition chamber 219 may be initiated by the control unit 227 sending an instruction to the precursor gas controller 225 to disconnect the purge gas delivery system 241 and to connect the second precursor delivery system 213 (containing the second precursor material) to the deposition chamber 219. Once connected, the second precursor delivery system 213 can deliver the second precursor material to the showerhead 231. The showerhead 231 can then disperse the second precursor material into the deposition chamber 219, wherein the second precursor material can be adsorbed on the exposed surfaces of the first layer 203 and react with the product of the first precursor material, the third precursor material, and the fourth precursor material in another self-limiting reaction to form a monolayer of the desired material, e.g., SiOCN, on the exposed surfaces of the first layer 203. In a particular embodiment the formation of the monolayer may occur as described in formula 2.

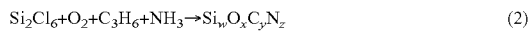

$$Si_2Cl_6 + O_2 + C_3H_6 + NH_3 \rightarrow Si_wO_xC_yN_z \quad (2)$$

In the embodiment discussed above to form a layer of SiOCN with hexachlorodisilane, oxygen, and propene, the ammonia may be introduced into the deposition chamber 219 at a flow rate of between about 1 slm and about 10 slm, such as about 4.5 slm, for about 18 seconds. Additionally, the deposition chamber 219 may be held at a pressure of between about 1 torr and about 10 torr, such as about 6.98 torr, and a temperature of between about 570° C. and about 650° C. However, as one of ordinary skill in the art will recognize, these process conditions are only intended to be illustrative, as any suitable process conditions may be utilized to introduce ammonia while remaining within the scope of the embodiments.

After the monolayer of the desired material, e.g., SiOCN, has been formed, the deposition chamber 219 may be purged (leaving behind the monolayer of the desired material on the exposed surfaces of the first layer 203) using, e.g., a purge gas from the purge gas delivery system 241 for about three seconds. After the deposition chamber 219 has been purged, a first cycle for the formation of the desired material has been completed, and a second cycle similar to the first cycle may be started. For example, the repeated cycle may introduce the first precursor material, purge with the purge gas, pulse with the third precursor, purge with the purge gas, pulse with the fourth precursor, purge with the purge gas, pulse with the second precursor, and purge with the purge gas. These cycles may be repeated until the second layer 205 has a second thickness $T_2$ of between about 10 Å and about 40 Å, such as about 2 nm.

However, as one of ordinary skill in the art will recognize, the above described process to form the first layer 203 is intended to be illustrative and is not intended to be limiting to the embodiments. Any other suitable process, such as initially pulsing the second precursor material (e.g., ammonia), purging with the purge gas, introducing the first precursor material (e.g., hexachlorodisilane), purging with the purge gas, introducing the third precursor material, purging with the purge gas, and introducing the fourth precursor material, and purging with the purge gas to complete a first cycle and then repeating the first cycle, may be utilized. This and any other suitable process to form the first layer 203 are fully intended to be included within the scope of the embodiments.

Figure 3A:
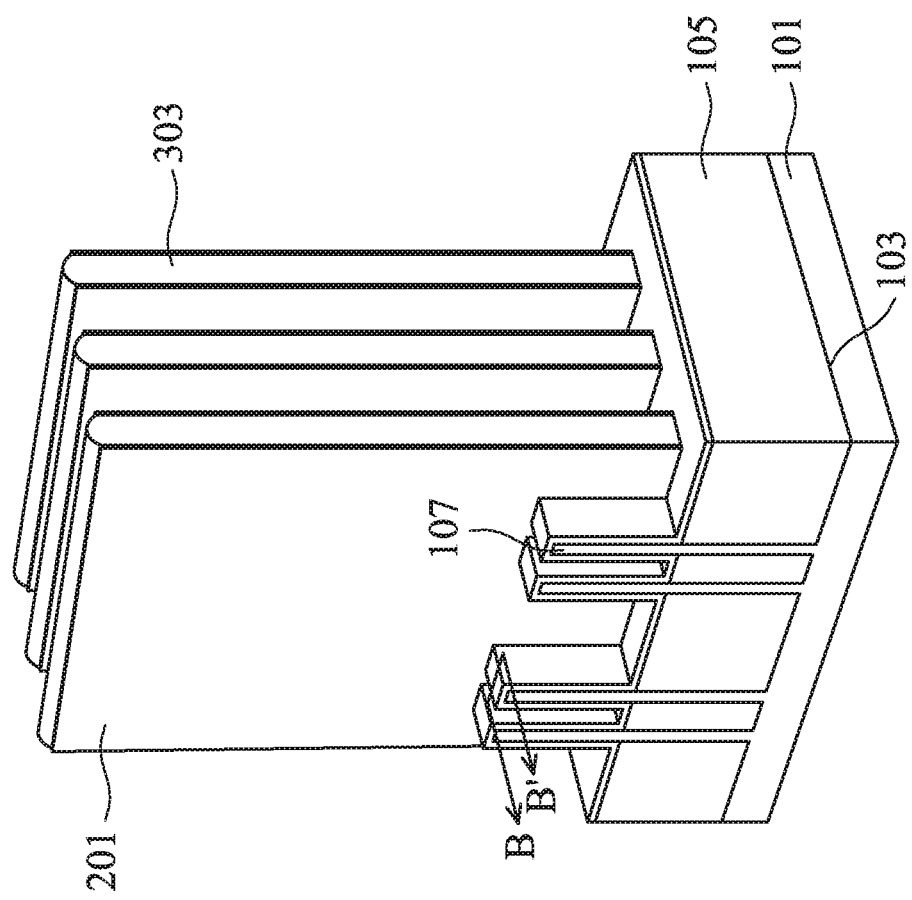
FIGS. 3A-4 illustrate a removal of a portion of the spacer material in accordance with some embodiments.
Figure 3B:
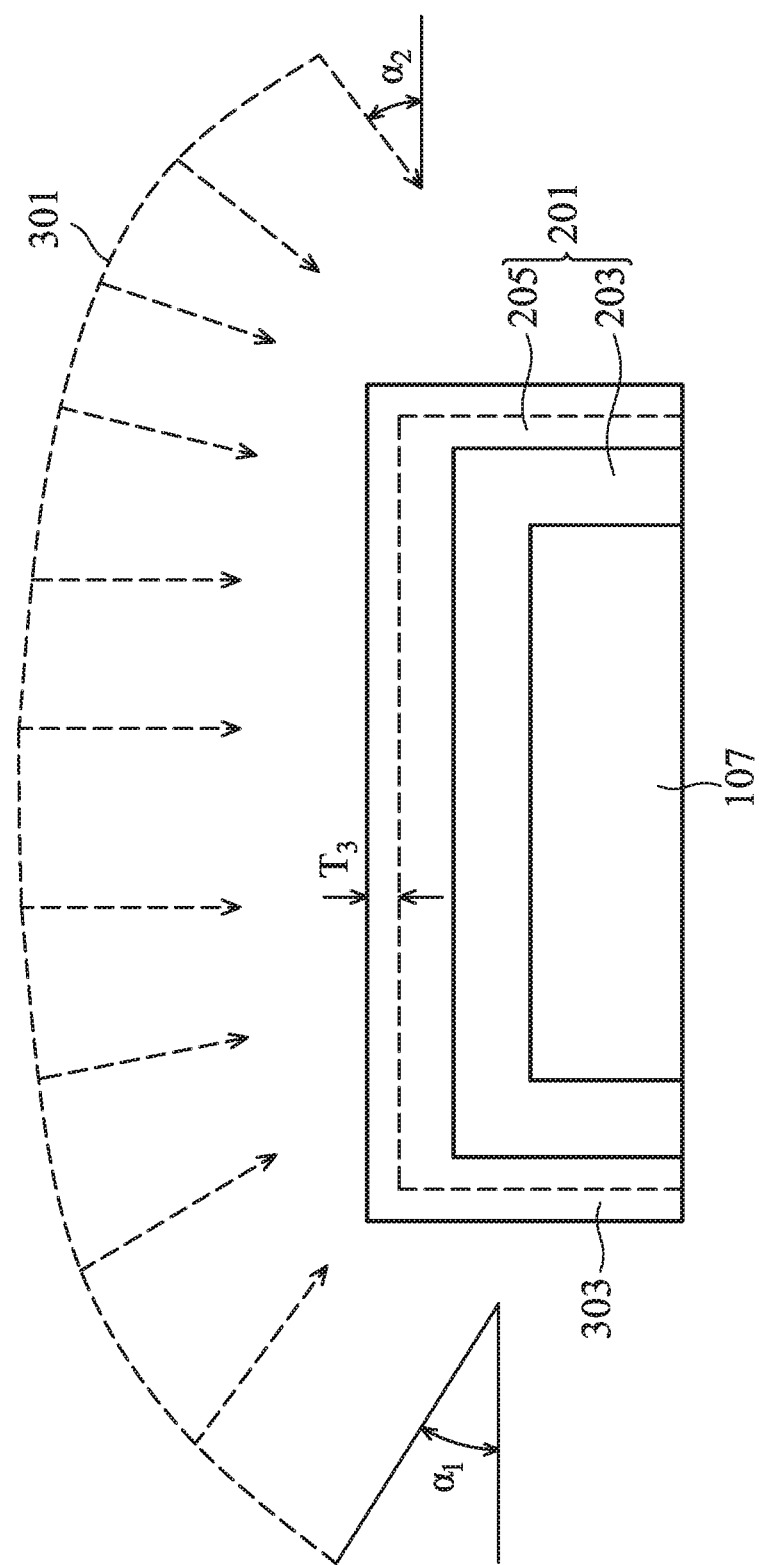

FIGS. 3A-3B illustrate a start of a removal cycle whereby a modified layer 303 is formed within the second layer 205 and then the modified layer 303 is removed in a removal process, with FIG. 3B illustrating a cross-sectional view of a fin 107 in FIG. 3A along line B-B'. In an embodiment the modified layer 303 may be formed using a first implantation (represented in FIG. 3B by the arrows labeled 301) of an etching modifier into the second layer 205 in order to modify the material of the second layer 205 (e.g., SiOCN). In an embodiment the implantation of the etching modifier is designed to modify the etching properties of the material of the second layer 205 so that the etching characteristics of the second layer 205 are closer to the etching characteristics of the first layer 203. In a particular embodiment in which the second layer 205 is SiOCN, the etching modifier is an element such as nitrogen, although any suitable material may be utilized.

In an embodiment the first implantation 301 may be a process such as an ion implantation, whereby ions of the desired etching modifier are accelerated and directed towards the second layer 205. The ion implantation process may utilize an accelerator system to accelerate ions of the etching modifier with an energy of from about 0.2 keV to about 1.5 keV, such as about 0.7 keV.

Additionally, in order to implant the etching modifier along the desired surfaces, the first implantation 301 may be performed as the angle of implant is continuously changed. In an example embodiment, the first implantation 301 may begin (represented by the lone solid arrow 301) at a first angle $\alpha_1$ of between about 30° and about 42°, such as about 30°. Once begun, the angle of implantation of the first implantation 301 may be changed at a rate of between about 1°/sec and about 10°/sec, such as about 2°/sec, until the first implantation 301 has implanted the etching modifier into opposing sidewalls of the second layer 205. In one embodiment the angle of implantation may be changed until the first implantation 301 implants the etching modifier into the second layer 205 at a second angle $\alpha_2$ of between about 30° and about 42°, such as about 42°. However, any suitable angles may be utilized.

By using the first implantation 301 to implant the etching modifier into the second layer 205, a first modified layer 303 is formed within the second layer 205. In an embodiment the first modified layer 303 may have a concentration of the etching modifier of between about 1E15/cm³ to about 1E16/ cm³, such as about 5E15/cm³, although any suitable concentration may alternatively be utilized. Additionally, the first modified layer 303 may have a third thickness $T_3$ of between about 2 nm and about 4 nm, such as about 4 nm. However, any suitable thickness may be utilized.

However, while the first implantation 301 implants the etching modifier into three surfaces of the second layer 205 (e.g., the top surface and two side surfaces), the first implantation 301 will not implant (or will only incidentally implant) the etching modifier into other surfaces. For example, surfaces of the second layer facing in a direction parallel with a longitudinal axis of the fins 107 will not be implanted by the first implantation 301.

Figure 4:
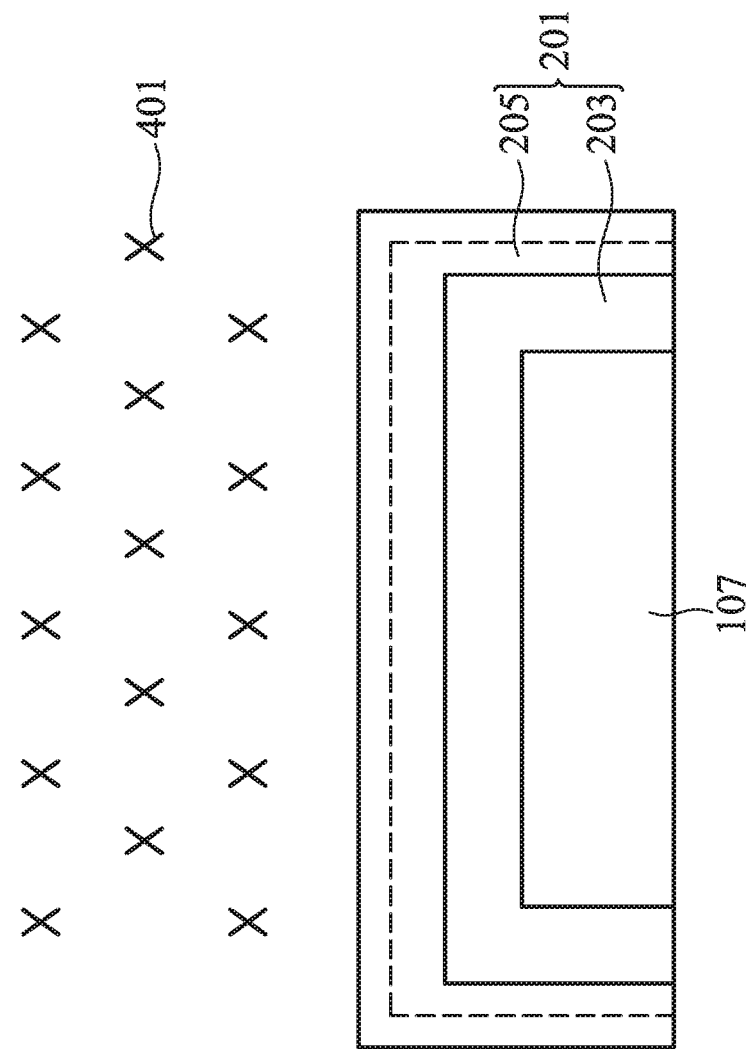

FIG. 4 illustrates that, once the first modified layer 303 has been formed within the second layer 205, the first modified layer 303 may be removed. In an embodiment the first modified layer 303 may be removed using an etching process (represented in FIG. 4 by the "X"s labeled 401) such as a wet etch that uses an etchant that is selective to the material of the modified layer (e.g., SiOCN doped with nitrogen). In a particular embodiment the etchant may be an etchant such as phosphoric acid ($H_3PO_4$), although any suitable etchant, such as diluted HF at a 1:500 ratio may be utilized.

In an embodiment in which the etching process 401 is a wet etch, the etching process 401 may be performed at a temperature of between about 80° C. and about 200° C., such as about 160° C. Additionally, the wet etch may be performed for a time of between about 10 s and about 60 s, such as about 20 seconds. However, any suitable parameters may be utilized.

Additionally, because the sidewalls of the second layer 205 adjacent to the gate electrode material 111 and directly over the fins 107 are not directly implanted and either do not have the etching modifier or only incidentally have the etching modifier incorporated therein, the sidewalls of the second layer 205 adjacent to the gate electrode material 111 and directly over the fins 107 (that part that will become the spacers 703) are only minimally removed during the wet etching process, if the material is removed at all.

Figure 5A:
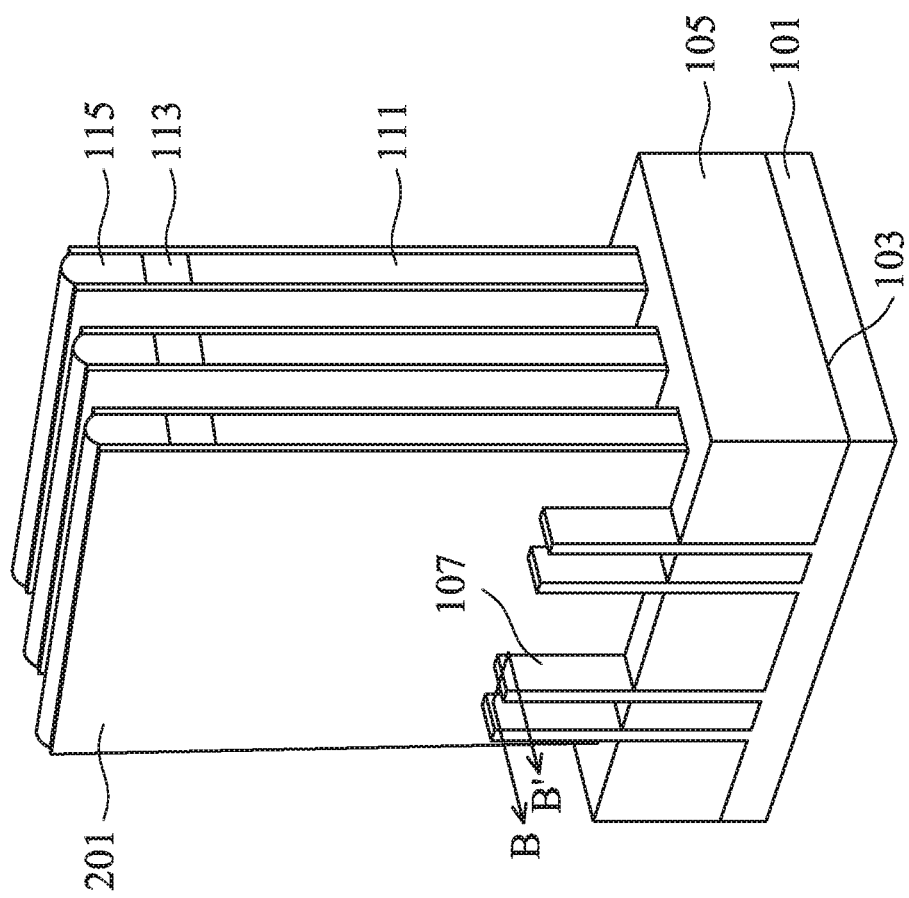
FIGS. 5A-5B illustrate a repetition to remove the spacer material in accordance with some embodiments.
Figure 5B:
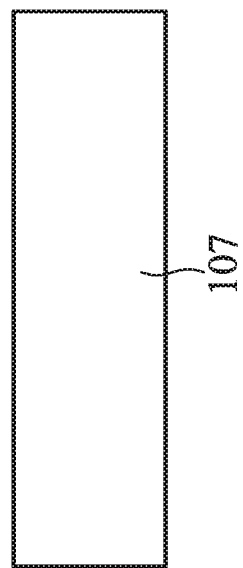

FIGS. 5A-5B (with FIG. 5B illustrating a cross-sectional view of one of the fins 107 of FIG. 5A along line B-B') illustrate that, once the first implantation 301 (see, FIGS. 3A-3B) has been performed to form the modified layer 303, and the etching process 401 (see FIG. 4) has been performed to remove the modified layer 303, the removal process may be repeated one or more times in order to continue the removal of the second layer 205 and then to remove the first layer 203 from over the surfaces of the fins 107 and fully expose the fins 107 for further processing. In an embodiment the cycle of the first implanting 301 to form the modified region followed by the etching process to remove the modified region may be performed an additional one to two times (after the first cycle described above with respect to FIGS. 3A-4), with each cycle removing between about 10 Å and about 30 Å, such as about 20 Å, of the second layer 205 or the first layer 203.

Optionally, once the last cycle has been completed to remove the last portion of the first layer 203 from the fins 107, a final, extra removal process may be performed in order to ensure that any remaining material of the first layer (e.g., silicon nitride) is removed and the fin 107 is ready for additional processing. In an embodiment the extra removal process may comprise a repeat of the etching process that was previously used to remove the modified layer. For example, the extra removal process may be a wet etch using phosphoric acid for a time of about 20 seconds, although any suitable removal process may be utilized.

In another embodiment, the first layer 203 may be removed without the use of the first implantation 301. In this embodiment, once the second layer 205 has been removed (as discussed above), the first layer 203 is removed using the wet etching process (e.g., a wet etch using phosphoric acid) in order to completely remove the material of the first layer 203 (e.g., silicon nitride). However, any suitable process may be used to remove the first layer 203.

By utilizing the bi-layer structure of the first layer 203 and the second layer 205, the sidewalls of the fin 107 may be cleaner than the removal of a single material of the second layer 205 by itself, and the total processing time may be reduced. For example, if a layer of SiOCN at 8 nm is used by itself along with a process including a power of 0.7 KeV, a concentration of 5E15 at a tilt angle of between 30°-42°, repeating the implantation twelve times (12×), and phosphoric acid for 20 seconds, is repeated 4 times, a residue along the sidewalls of the fin 107 may range from 2.8 nm to 3.2 nm. However, in an embodiment as described herein, with a layer of SiN (at 1 nm) along with the layer of SiOCN (at 7 nm), a power of 0.7 KeV, a concentration of 5E15 at a tilt angle of between 30°-38°, a 12× implantation, and phosphoric acid for 20 seconds, is repeated 3 times and followed by a cleaning etch of phosphoric acid for 35 seconds, the residue is less than 1 nm, such as between 0.89 nm and 0.99 nm.

Additionally, by using the first layer 203 directly adjacent to the gate electrode material 111, the high quality of the material of the first layer 203 (e.g., silicon nitride), can help to avoid implantation and etching damage that would otherwise occur to the fin side wall and help reduce the recess poly gate interlayer oxide (RPG I/O) removal inner film lost. Finally, by adopting the bi-layer structure, a 50% improvement in the fin side wall pull back etch rate may be achieved.

Figure 6A:
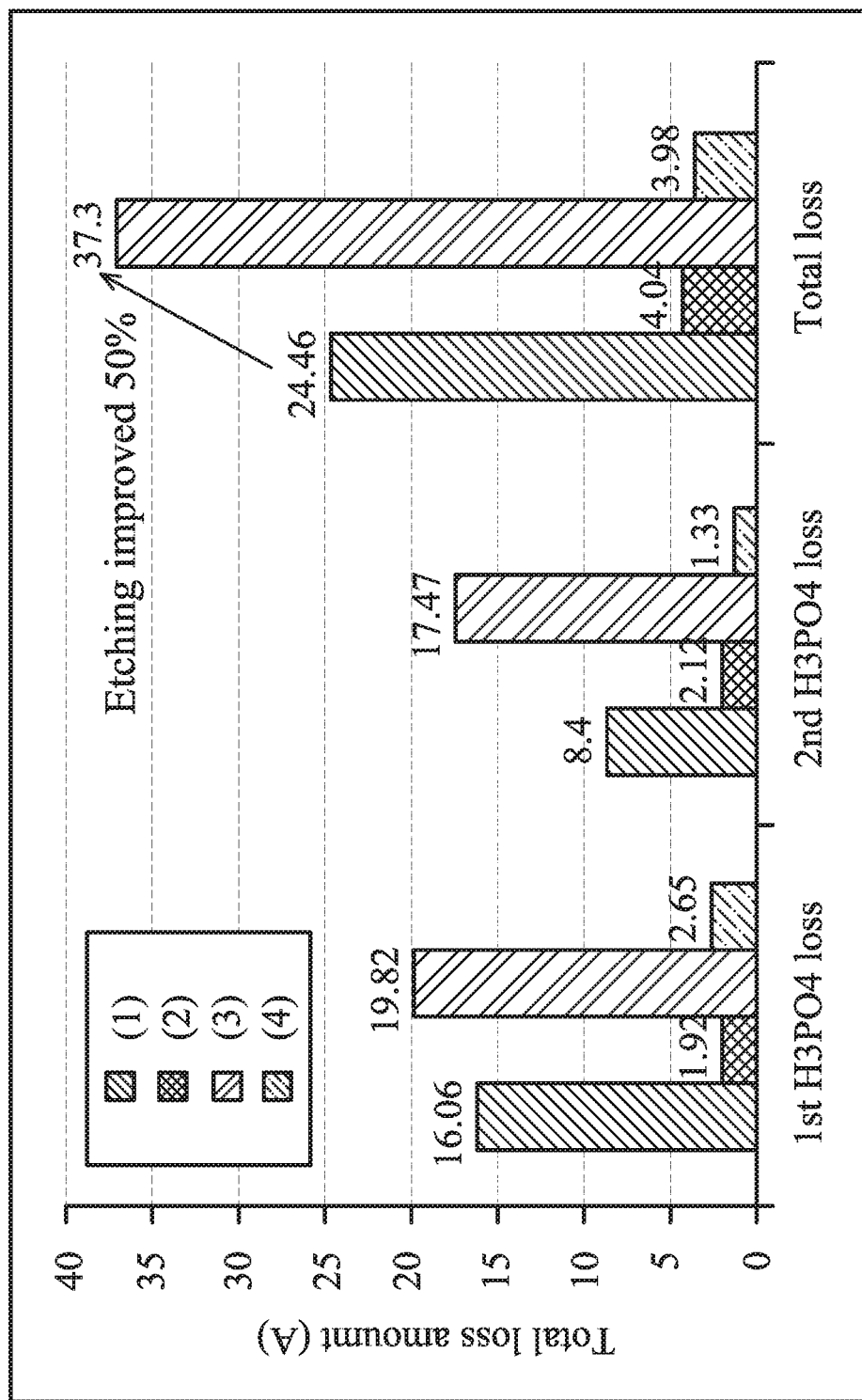
FIGS. 6A-6B illustrate test data in accordance with some embodiments.
Figure 6B:
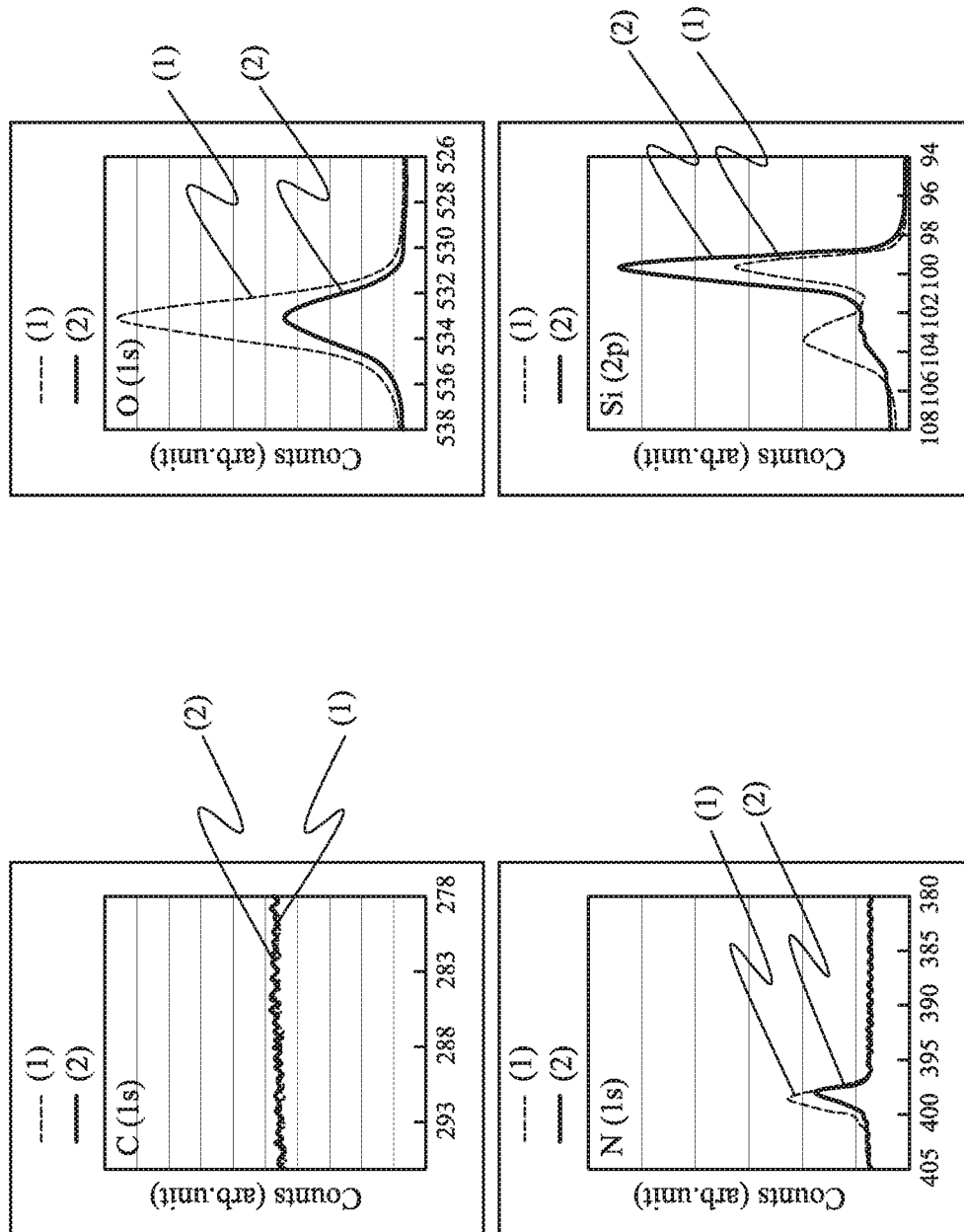

FIGS. 6A-6B illustrate test data of the results of using the bi-layer structure. Looking first at FIG. 6A, there is shown the total removal amount for four different types of materials: (1) a single layer of SiOCN that has been doped with nitrogen, (2) a single layer of SiOCN that has not been doped with nitrogen, (3) a bi-layer structure of silicon nitride and SiOCN, wherein the SiOCN has been implanted, and (4) a bi-layer structure of silicon nitride and SiOCN, wherein the SiOCN has not been implanted. As can be seen, the bi-layer structure of silicon nitride and SiOCN, wherein the SiOCN has been implanted, after a first etch using $H_3PO_4$ for 20 seconds, has 19.82 Å removed, which is greater than the doped single layer of SiOCN at 16.06 Å, the single layer of SiOCN at 1.92 Å, and the bi-layer structure of silicon nitride and SiOCN, wherein the SiOCN has not been implanted at 2.65 Å.

Additionally, after a second wet etch using $H_3PO_4$ for another 20 seconds, the bi-layer structure of silicon nitride and SiOCN, wherein the SiOCN has been implanted, has 17.47 Å removed, which is greater than the doped single layer of SiOCN at 8.4 Å, the single layer of SiOCN at 2.12 Å, and the bi-layer structure of silicon nitride and SiOCN, wherein the SiOCN has not been implanted at 1.33 Å. Given this, a greater than 50% improvement in the removal rate of the material may be obtained.

FIG. 6B illustrates comparisons of different elements for both (1) a single layer of SiOCN at 8 nm that has been implanted as well as (2) the bi-layer structure of silicon nitride (at 1 nm) and SiOCN (at 7 nm) that has been implanted. This data illustrates results from the fin 107 after either the SiOCN or the SiOCN and silicon nitride have been removed as described herein. As can be seen, because there is no carbon signal, the SiOCN has been removed from the fins 107, while the presence of the nitrogen comes from the implantation that has occurred. However, the single layer of SiOCN has a higher oxygen peak which illustrates that, without the silicon nitride layer, there is additional damage from the nitrogen implantation. Finally, the single peak of silicon at the 99 eV peak indicates that there Si—Si bonds, which indicates that any epitaxial growth would provide a better quality of material.

Figure 7A:
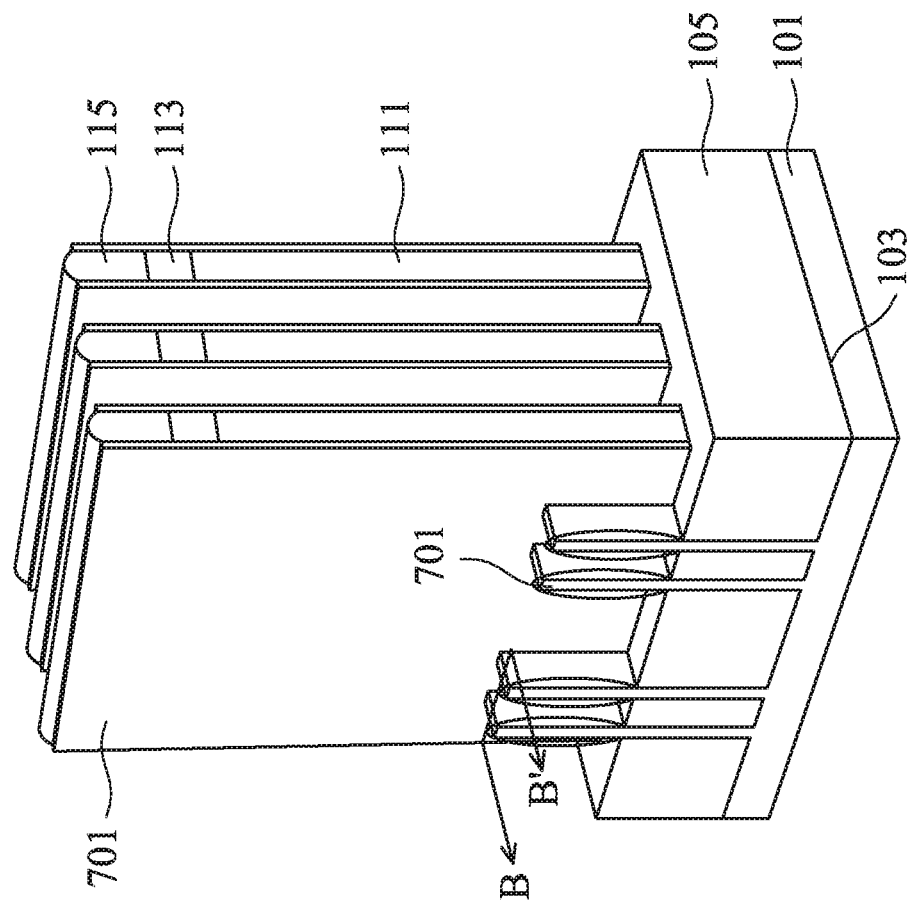
FIGS. 7A-7B illustrate a growth of source/drain regions in accordance with some embodiments.
Figure 7B:
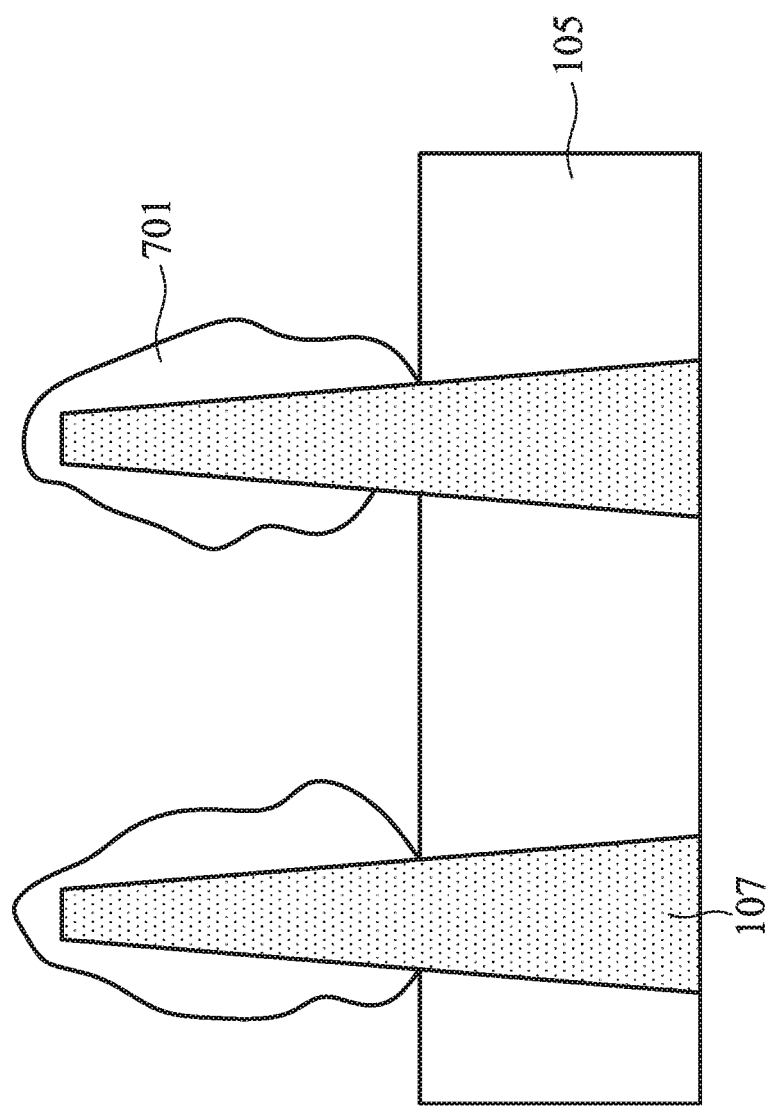

FIGS. 7A-7B illustrate that, once the spacers 703 have been formed, source/drain regions 701 may be grown on the fins 107. In an embodiment the source/drain regions 701 may be grown and, in some embodiments the source/drain regions 701 may be grown to form a stressor that will impart a stress to the channel regions of the fins 107 located underneath the gate stacks 117, such as SiGeB. In an embodiment wherein the fins 107 comprise silicon and the FinFET is a p-type device, the source/drain regions 701 may be grown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

Once the source/drain regions 701 are formed, dopants may be implanted into the source/drain regions 701 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the gate stacks 117 and the first spacers 703 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

FIG. 7B illustrates a particular embodiment in which a bi-layer of silicon nitride (at 1 nm) and SiOCN (at 7 nm) with a nitrogen implantation is utilized. In this embodiment the bi-layer silicon nitride and SiOCN is removed using a wet etching process using a wet etch with an etchant such as $H_3PO_4$. Once the wet etching process has been completed, a dry etching process (with, e.g., $NF_3$ and $NH_3$) is then utilized to trim the fin and clean the residue on the fin sidewall surface in preparation for the next epitaxial process. By utilizing this bi-layer approach, the epitaxial silicon germanium or silicon phosphorous that is formed will have an improved quality. Additionally, with the cleaning of the sidewalls of the fin 107, and its corresponding reduction in the amount of residue, a better epitaxial profile may be achieved, allowing for greater control of the overall process.

Additionally, further processing may be performed after the formation of the source/drain regions 701. In some embodiments a silicide such as silicon germanium or silicon phosphorous may be formed on the source/drain regions 701, an inter-layer dielectric (not separately illustrated) may be formed over the source/drain regions 701, and a replacement gate process, whereby the material of the gate electrode material 111 is removed and replaced with another conductive material, may be performed. Any suitable further processing may be performed and all such processes are fully included within the scope of the embodiments.

In accordance with an embodiment, a method of manufacturing a semiconductor device comprises forming a semiconductor fin over a semiconductor substrate and forming a gate stack over a portion of the semiconductor fin. A spacer material is formed on the semiconductor fin and the gate stack, wherein the forming the spacer material further comprises using atomic layer deposition to deposit a first material on the semiconductor fin and using atomic layer deposition to deposit a second material on the first material, wherein the second material is different from the first material. The spacer material is removed from the semiconductor fin, wherein the removing the spacer material further comprises implanting an etching modifier into the spacer material to form a modified spacer material and removing the modified spacer material.

In accordance with another embodiment, a method of manufacturing a semiconductor device comprises depositing a first spacer material directly onto a semiconductor fin and depositing a second spacer material directly onto the first spacer material to form a bi-layer spacer material. A first portion of the bi-layer spacer material is removed using a first cycle, wherein the first cycle comprises implanting an etching modifier into the bi-layer spacer material and wet etching the bi-layer spacer material after the implanting the etching modifier. A second portion of the bi-layer spacer material sin removed, wherein the removing the second portion of the bi-layer spacer material comprises repeating the first cycle one or more times.

In accordance with yet another embodiment, a method of manufacturing a semiconductor device comprising depositing silicon nitride in direct contact with a semiconductor fin and depositing silicon oxycarbonitride in direct contact with the silicon nitride. Nitrogen is implanted into the silicon oxycarbonitride and the silicon oxycarbonitride and the silicon nitride are removed with one or more wet etches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a semiconductor fin over a semiconductor substrate;
    forming a gate stack over a portion of the semiconductor fin;
    forming a spacer material on the semiconductor fin and the gate stack, wherein the forming the spacer material further comprises:
        using atomic layer deposition to deposit a first material on the semiconductor fin;
        using atomic layer deposition to deposit a second material on the first material, wherein the second material is different from the first material;

removing the spacer material from the semiconductor fin, wherein the removing the spacer material further comprises:
  implanting an etching modifier into the spacer material to form a modified spacer material; and
  removing the modified spacer material.

2. The method of claim 1, wherein the removing the spacer material further comprises:
  after the removing the modified spacer material, implanting the etching modifier into the spacer material to form a second modified spacer material; and
  removing the second modified spacer material.

3. The method of claim 2, wherein the removing the spacer material further comprises:
  after the removing the second modified spacer material, implanting the etching modifier into the spacer material to form a third modified spacer material; and
  removing the third modified spacer material.

4. The method of claim 3, wherein the removing the spacer material further comprises performing a wet etch after the removing the third modified spacer material.

5. The method of claim 1, wherein the first material is silicon nitride.

6. The method of claim 5, wherein the second material is SiOCN.

7. The method of claim 6, wherein the etching modifier is nitrogen.

8. The method of claim 7, wherein the removing the modified spacer material comprises at least in part a wet etch with phosphoric acid.

9. A method of manufacturing a semiconductor device, the method comprising:
  depositing a first spacer material directly onto a semiconductor fin;
  depositing a second spacer material directly onto the first spacer material to form a bi-layer spacer material;
  removing a first portion of the bi-layer spacer material using a first cycle, wherein the first cycle comprises:
    implanting an etching modifier into the bi-layer spacer material; and
    wet etching the bi-layer spacer material after the implanting the etching modifier; and
  removing a second portion of the bi-layer spacer material, wherein the removing the second portion of the bi-layer spacer material comprises repeating the first cycle one or more times.

10. The method of claim 9, wherein the depositing the first spacer material is performed at least in part with an atomic layer deposition process utilizing a first precursor and the depositing the second spacer material is performed at least in part with an atomic layer deposition process utilizing the first precursor.

11. The method of claim 10, wherein the first precursor is hexachlorodisilane.

12. The method of claim 11, wherein the depositing the first spacer material and the depositing the second spacer material are performed in-situ with each other.

13. The method of claim 12, wherein the depositing the first spacer material is performed at a first temperature and the depositing the second spacer material is performed at the first temperature.

14. The method of claim 9, wherein the repeating the first cycle one or more times is performed at least two times.

15. The method of claim 14, further comprising performing a cleaning etch after the repeating the first cycle, wherein the cleaning etch utilizes a first etchant and the wet etching utilizes the first etchant.

16. A method of manufacturing a semiconductor device, the method comprising:
  depositing silicon nitride in direct contact with a semiconductor fin;
  depositing silicon oxycarbonitride in direct contact with the silicon nitride;
  implanting nitrogen into the silicon oxycarbonitride; and
  removing the silicon oxycarbonitride and the silicon nitride with one or more wet etches.

17. The method of claim 16, wherein the implanting the nitrogen is performed with a moving implantation process.

18. The method of claim 16, wherein the depositing the silicon nitride deposits the silicon nitride to a thickness of about 2 nm.

19. The method of claim 16, wherein the depositing the silicon oxycarbonitride deposits the silicon oxycarbonitride to a thickness of about 2 nm.

20. The method of claim 16, further comprising growing a source/drain region on surfaces exposed by the removing the silicon oxycarbonitride and the silicon nitride.

* * * * *